(12) United States Patent
Miyamoto (10) Patent No.: US 8,063,319 B2
(45) Date of Patent: Nov. 22, 2011

(54) ELECTRICAL JUNCTION BOX AND METHOD FOR ASSEMBLING THE SAME

(75) Inventor: Takashi Miyamoto, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 261 days.

(21) Appl. No.: 12/461,684

(22) Filed: Aug. 20, 2009

(65) Prior Publication Data

US 2010/0101857 A1    Apr. 29, 2010

(30) Foreign Application Priority Data

Oct. 28, 2008   (JP) ................................. 2008-277474

(51) Int. Cl.
*H05K 7/02*    (2006.01)
(52) U.S. Cl. .................... 174/541; 174/560; 361/752
(58) Field of Classification Search .................. 174/560, 174/541, 544; 439/76.2; 361/752
See application file for complete search history.

(56) References Cited

U.S. PATENT DOCUMENTS

| | | | | |
|---|---|---|---|---|
| 5,703,757 A | * | 12/1997 | Hayes et al. | 361/752 |
| 6,069,315 A | * | 5/2000 | Tang | 174/50 |
| 6,194,656 B1 | * | 2/2001 | Kondo et al. | 174/535 |
| 6,430,054 B1 | * | 8/2002 | Iwata | 361/752 |
| 6,570,088 B1 | * | 5/2003 | Depp et al. | 174/50 |
| 6,911,598 B2 | * | 6/2005 | Onizuka et al. | 174/50 |
| 7,381,889 B2 | * | 6/2008 | Hara | 174/50 |
| 7,619,896 B2 | * | 11/2009 | Yamashita et al. | 361/720 |
| 7,733,632 B2 | * | 6/2010 | Ito | 361/626 |
| 2008/0030932 A1 | | 2/2008 | Shimazaki et al. | |
| 2008/0105460 A1 | * | 5/2008 | Kasai | 174/527 |
| 2009/0117758 A1 | * | 5/2009 | Yamaguchi | 439/76.2 |
| 2009/0321129 A1 | * | 12/2009 | Darr et al. | 174/520 |

FOREIGN PATENT DOCUMENTS

JP   A-2007-134506   5/2007
JP   A-2007-242867   9/2007

* cited by examiner

*Primary Examiner* — Hung Ngo
(74) *Attorney, Agent, or Firm* — Oliff & Berridge, PLC (57) ABSTRACT

An electrical junction box may include a casing with a lower casing member and an upper casing member. A multi-layered circuit board may be retained in the electrical junction box. The multi-layered circuit board may contain a lower layer circuit board, an upper layer circuit board and an insulation plate that is disposed between and supports the lower layer circuit board and the upper layer circuit board. A rib and a boss may project from the lower casing member and may contact the insulation plate without contacting either the lower layer circuit board or the upper layer circuit board. In this manner, no physical stress is applied to a surface of either the lower layer circuit board or the upper layer circuit board thereby preventing detachment of an electronic component from the multi-layered circuit board.

20 Claims, 11 Drawing Sheets

Related Art

ELECTRICAL JUNCTION BOX AND METHOD FOR ASSEMBLING THE SAME

CROSS-REFERENCE TO RELATED APPLICATION

This application claims priority to JP 2008-277474 filed in Japan on Oct. 28, 2008, the entire disclosure of which is hereby incorporated by reference in its entirety.

BACKGROUND

This invention relates to an electrical junction box and a method for assembling the same. Particularly, the electrical junction box may includes features that allow a circuit board to be securely mounted within the electrical junction box in a manner that prevents a load placed on a supporting member that supports the circuit board from being transferred to the circuit board, thereby protecting the circuit board from stress, damage and deformation and thereby preventing an electronic component mounted on the circuit board from being detached from the circuit board.

A vehicle-mounted electrical junction box or the like may contain, in high density, a wide range of circuit members stacked on one another. In some embodiments, a multilayered circuit board assembly that mounts a circuit member such an electronic component is contained in the electrical junction box.

Embodiments of the electrical junction box may include a casing that includes an upper casing member and a lower casing member. The stacked circuit member may be contained in the casing. Accordingly, it is necessary to hold the multilayered circuit board assembly in the electrical junction box.

Figure 11:
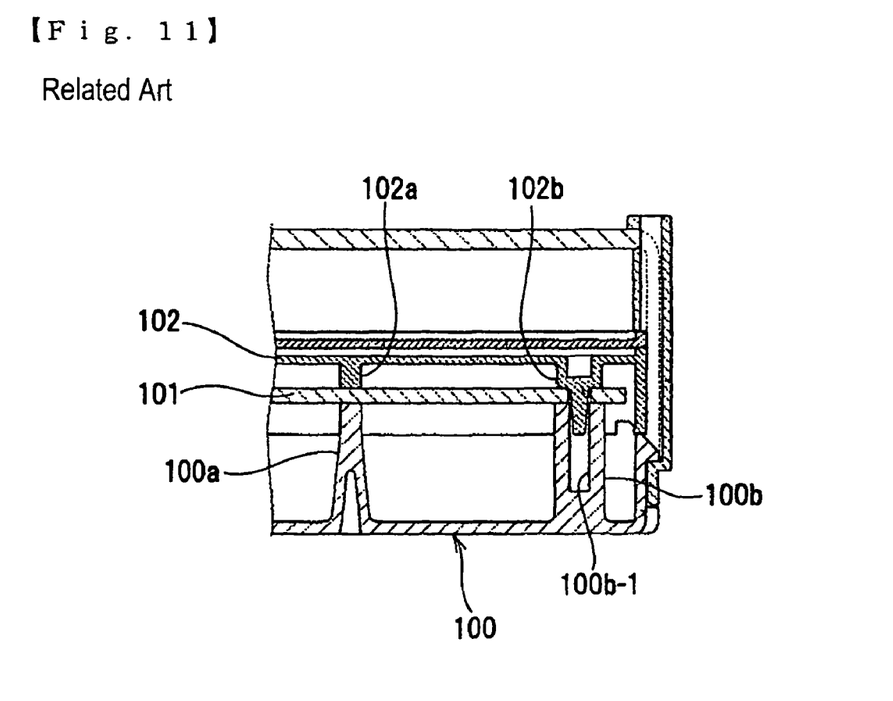
FIG. 11 is a sectional view of a main part of a prior art electrical junction box.

For example, FIG. 11 shows a related art electrical junction box, which has been disclosed in JP 2007-134506 A. As shown in FIG. 11, a circuit board 101 is mounted on lower bosses 100a and 100b projecting from a bottom wall of a lower casing member 100. A plate 102 disposed above the circuit board 101 is provided on a bottom surface at positions faced to the lower bosses 100a and 100b with upper bosses 102a and 102b. The lower boss 100a and upper boss 102a clamp the circuit board 101 in a vertical direction. The upper boss 102b passes through the circuit board 101 and enters a receiving aperture 100b-1 provided in an upper end of the lower boss 100b. Thus, the circuit board 101 is positioned and held on the lower casing member 100.

As described above, when the circuit board 101 is clamped directly between the upper bosses 102a, 102b and the lower bosses 100a, 100b, a load is applied directly to the points of contact between the circuit board 101 and the bosses 100a to 102b. Consequently, there is a possibility that the circuit board will be subject to strain, deformation and/or damage and, thus, there is a possibility that an electronic component mounted on the multilayered circuit board assembly will be detached from the assembly.

In view of the above problems and other problems, the exemplary embodiments provide an electrical junction box that can position and hold a circuit board in a casing so that a positioning member does not contact directly with the circuit board, thereby preventing detachment of electronic components from the circuit board.

SUMMARY

An electrical junction box in accordance with an exemplary embodiment may include a casing including a lower casing member and an upper casing member, and a multilayered circuit board assembly that may include a lower layer circuit board, an upper layer circuit board, and an insulation plate disposed between the upper and lower circuit boards. An electronic component may be mounted through the insulation plate on a top surface of the lower layer circuit board without contacting a bottom surface of the upper layer circuit board. The upper and lower layer circuit boards may be secured to the insulation plate. A rib assembly and a boss may project from the lower casing member. The rib assembly and the boss may contact the insulation plate to support the plate without contacting surfaces of the upper and lower circuit boards in the multilayered circuit board assembly on which the electronic component is mounted.

The boss may be a cylindrical support post standing upward from the bottom wall of the lower casing member at a position apart from the peripheral wall of the lower casing member. The rib assembly may stand upward from the bottom wall of the lower casing member and may be continued to the peripheral wall of the lower casing member.

As described above, in an embodiment in which the multilayered circuit board assembly is mounted in the electrical junction box, the circuit boards may be attached to the insulation plate in the box. Using such an approach, the circuit boards may contact the insulation plate and the boss projecting from the lower casing member may contact the insulation plate, thereby supporting the multilayered circuit board assembly without contacting a surface of the circuit board on which the electronic component is mounted.

Thus, no load is applied to the surface of the circuit board, because the rib assembly and boss do not contact directly with the surfaces of the circuit board on which the electronic component is not mounted. Accordingly, no stress or strain is applied to a surface of the circuit board and it is possible to prevent the mounted electronic component from being detached from the circuit board.

The multilayered circuit board assembly may include embodiments in which a single upper layer circuit board and a single lower layer circuit board are used, and embodiments in which the upper and lower circuit boards are stacked on each other without interposing any insulation plate between them.

The rib assembly may include a first rib member and a second rib member. The first rib member may pass a peripheral edge of the lower layer circuit board and may contact a bottom surface of a peripheral edge of the insulation plate. The boss may pass through a through-hole in the lower layer circuit board and may contact a bottom surface of the insulation plate or a bottom surface of the upper layer circuit board. The second rib member may pass a peripheral edge of the insulation plate and may contact a bottom surface of the upper layer circuit board.

Also, the lower layer circuit board and insulation plate may be connected by a second screw. The insulation plate and upper layer circuit board may include screw apertures that may be aligned with each other. A first screw may be screwed through the screw apertures into a screw cylinder projecting from an inner surface of the upper casing member.

In the electrical junction box of the present invention, as described after, the upper casing member may be turned upside down and held on an assembling jig. The upper layer circuit board, insulation plate, and lower layer circuit board may be installed in order in the upper casing member. Then, the lower casing member, from which the boss and the rib assembly project, may be aligned with, mounted and locked on the upper casing member. Accordingly, the upper layer circuit board may attach to the upper casing member before the insulation plate is attached to the upper casing member. A screw cylinder projecting from the upper casing member may be inserted into the screw apertures in the upper layer circuit board and insulation plate, and a first screw may be used to fasten the upper layer circuit board and the insulation plate to the screw cylinder. A second screw may be used to fasten the lower layer circuit board to the insulation plate.

Thus, the upper and lower layer circuit boards are positioned and held in the upper and lower casing members.

The circuit boards may be previously bonded to the insulation plate by an adhesive without using any screws.

Preferably, the boss may be positioned substantially in a central position of a triangular area defined by three first screws.

By positioning the boss in a central position relative to the triangular area defined by three first screws, the boss and the vertices of the triangle may absorb and moderate stress from the upper casing member.

Embodiments of the present invention provide a method for assembling an electrical junction box described above. The method may include, turning the upper casing member topside down to direct an opening upward, disposing the turned upper casing member on an assembling jig, inserting the upper layer circuit board and the insulation plate in order in the upper casing member, interconnecting the insulation plate and upper layer circuit board by an upper casing screw, inserting the lower layer circuit board into the upper casing member, interconnecting the lower layer circuit board and insulation plate by a screw, attaching the lower casing member to the upper casing member, and bringing the first rib member and boss projecting from an inner surface of the lower casing member into contact with the insulation plate and bringing the second rib member into contact with a bottom surface of the upper layer circuit board to position and hold the circuit board assembly in the casing.

After the electrical junction box is assembled by the above manner, the electrical junction box may be turned so that the bottom surface of the lower casing member is directed downward. The boss and the rib assembly projecting from the inner surface of the bottom wall of the lower casing member can position and hold the insulation plate and the upper and lower layer circuit boards mounted on the upper and lower surfaces of the insulation plate.

As described above, in the electrical junction box that contains the multilayered circuit board assembly in the casing comprising the upper and lower casing members, because the boss and the rib assembly for positioning and holding the multilayered circuit board assembly do not directly contact the surfaces of circuit boards on which an electronic component is mounted, it is possible to prevent the circuit boards from deforming or straining by the stress caused by contact between them and thereby prevent detachment of an electronic component from the circuit boards.

DETAILED DESCRIPTION OF EMBODIMENTS

Referring now to the drawings, an example embodiment of an electrical junction box in accordance with the present invention will be described below.

Figure 1:
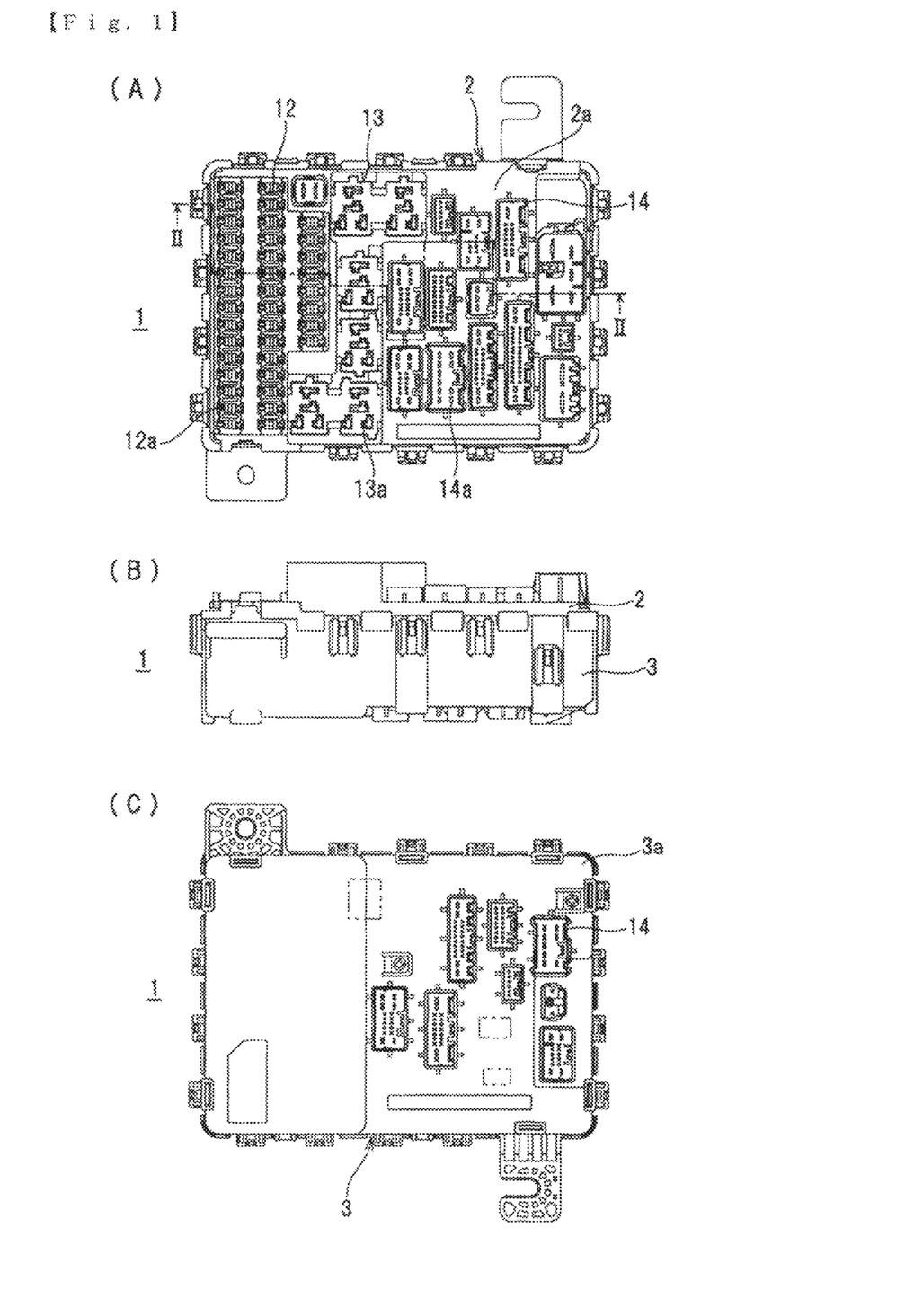
FIG. 1A is a plan view of an embodiment of an electrical junction box in accordance with an example embodiment of the present invention.
FIG. 1B is a front elevation view of the electrical junction box shown in FIG. 1A.
FIG. 1C is a bottom view of the electrical junction box shown in FIG. 1A.
Figure 2:
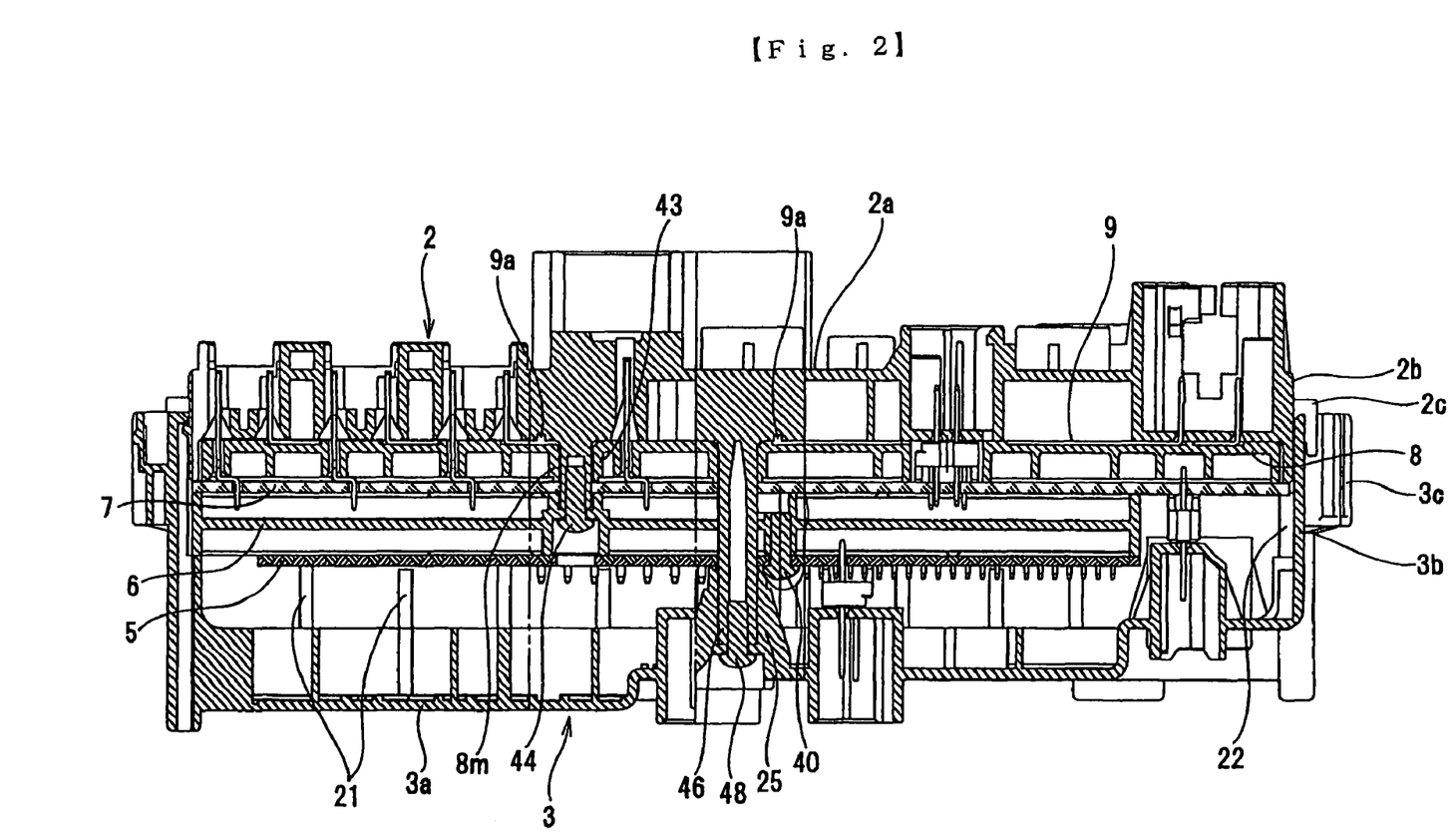
FIG. 2 is a longitudinal section view of the electrical junction box taken along lines II-II in FIG. 1A.

An electrical junction box 1 shown in FIGS. 1A to 1C may be mounted in a motor vehicle. FIG. 1A is a plan view of an example embodiment of electrical junction box 1 in accordance with the present invention. FIG. 1B is a front elevation view of electrical junction box 1 shown in FIG. 1A. FIG. 1C is a bottom view of electrical junction box 1 shown in FIG. 1A. FIG. 2 is a longitudinal section view of electrical junction box 1 taken along lines II-II in FIG. 1A.

Electrical junction box 1 may include a casing that may include an upper casing member 2 and a lower casing member 3. The casing members 2 and 3 may be locked to each other to constitute the casing. A multilayered circuit board assembly may be contained in an interior of the casing. As shown in FIG. 2, the multilayered circuit board assembly may include an upper layer circuit board 7, a lower layer circuit board 5, and an insulation plate 6 disposed between lower layer circuit board 5 and upper layer circuit board 7. Also, an insulation plate 8 may be disposed between upper layer circuit board 7 and an upper wall 2a of upper casing member 2.

Figure 9:
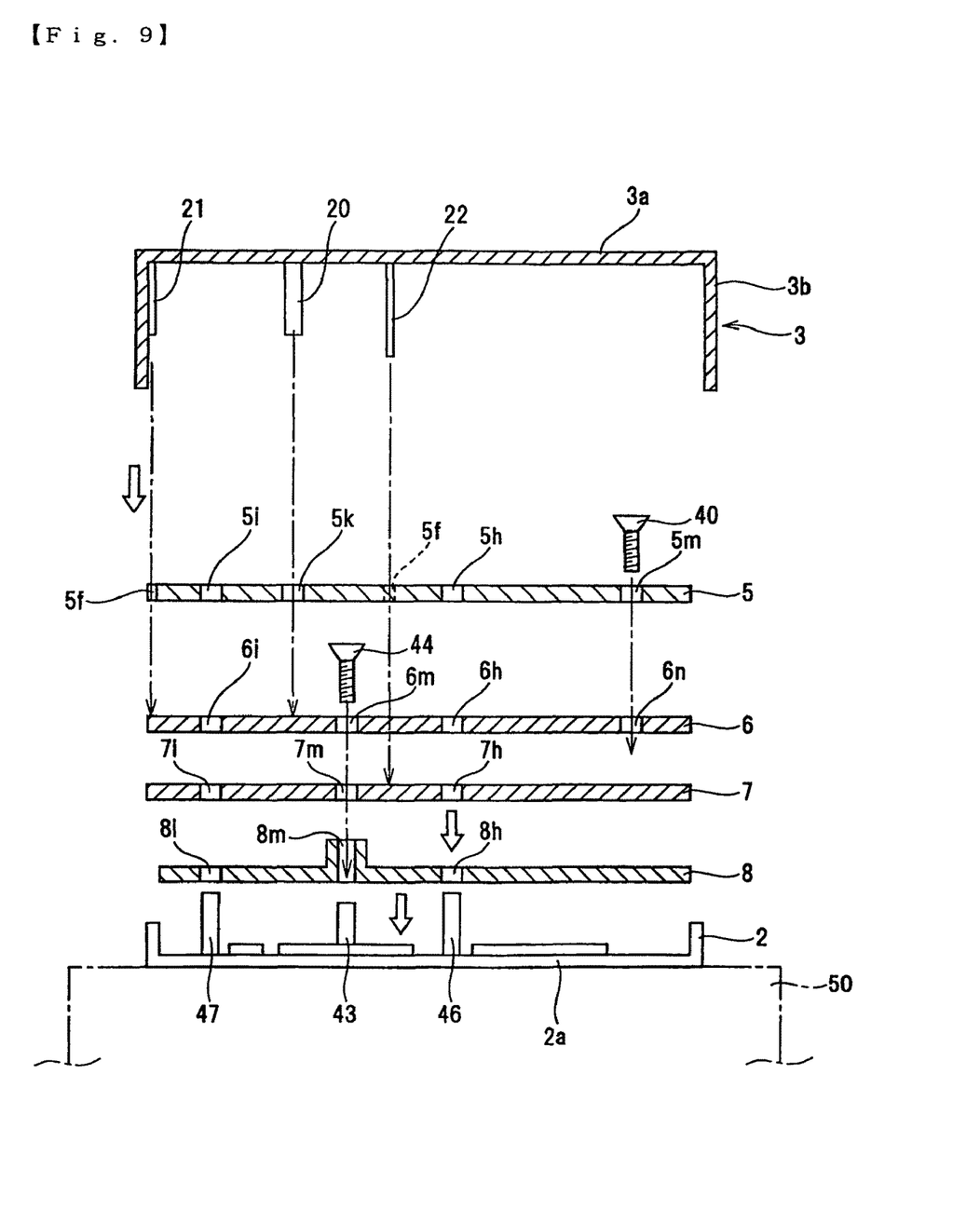
FIG. 9 is an exploded schematic view of a casing and a multilayered circuit board assembly, illustrating a method for assembling the electrical junction box in accordance with an example embodiment of the present invention.

FIG. 9 schematically shows a method of assembling electrical junction box 1. Upper casing member 2 may be turned upside down so that an upper wall 2a becomes a bottom side. Turned upper casing member 2 may be held on an assembling jig 50. Insulation plate 8, upper layer circuit board 7, insulation plate 6, lower layer circuit board 5 may be installed in order in the upper casing member 2. Finally, lower casing member 3 may be mounted and locked on the upper casing member 2.

Upper casing member 2 and lower casing member 3 may be resin molding products and may be formed into elongated configurations.

As shown in FIG. 1A, upper casing member 2 may be provided on the upper wall 2a with a fuse-containing section 12, a relay-containing section 13, and a connector-containing section 14. As shown in FIG. 2, an attaching piece 9a bent from a bus bar 9 may be pressed into and held in a receiving aperture provided in an inner surface of the upper wall 2a. Tabs provided on bus bar 9 may be inserted into terminal apertures in the fuse-containing section 12, relay-containing section 13, and connector-containing section 14.

Peripheral wall 2b of upper casing member 2 may have dimensions that are matched to the dimensions of insulation plate 8, which may be disposed inside the peripheral wall 2b. Therefore, a height of peripheral wall 2b may be relatively small in a vertical direction. On the other hand, a peripheral wall 3b of the lower casing member 3 may have dimensions that surround the multilayered circuit board assembly including upper lower circuit board 7 and lower circuit board 5 and insulation plate 6, so a height of peripheral wall 3b may be relatively great in the vertical direction.

Upper casing member 2 may include locking portions 2c (FIG. 2) on an outer surface of the peripheral wall 2b, while the lower casing member 3 may include locked portions 3c (FIG. 2) on an outer surface of the peripheral wall 3b. When locking portions 2c lock the locked portion 3c, the upper and lower casing members 2 and 3 are interlocked to each other to form the casing.

Figure 3:
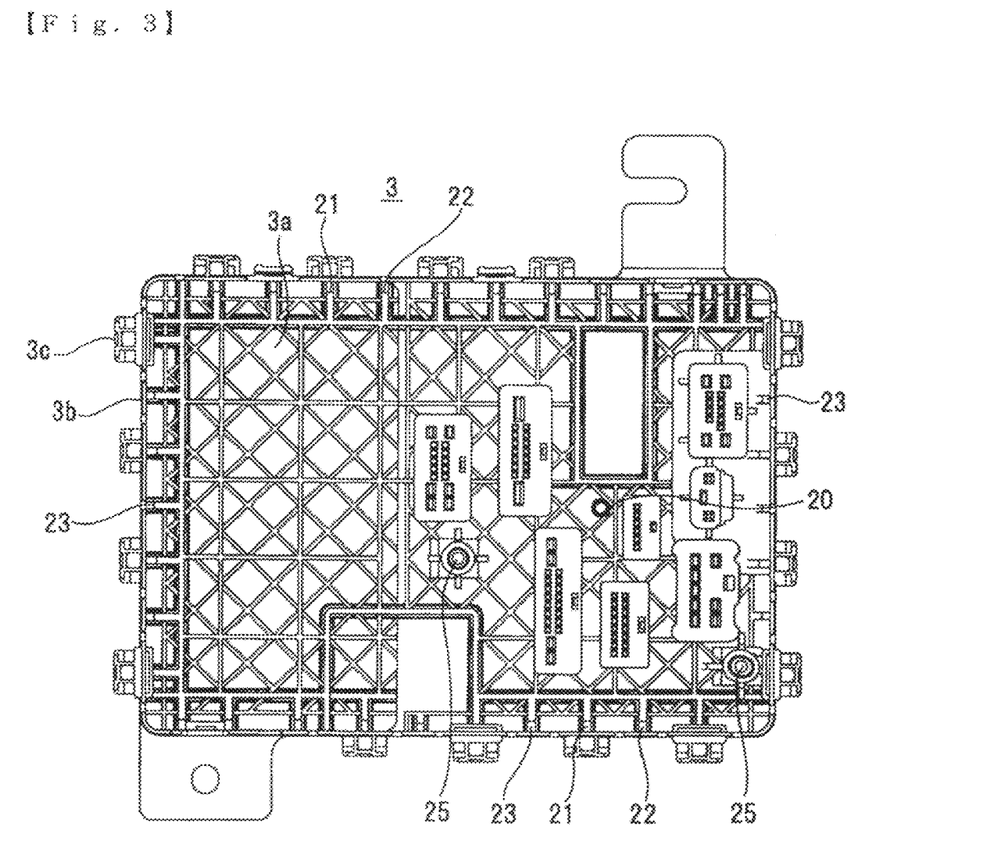
FIG. 3 is a plan view of a lower casing member, illustrating an interior of the lower casing member.
Figure 4:
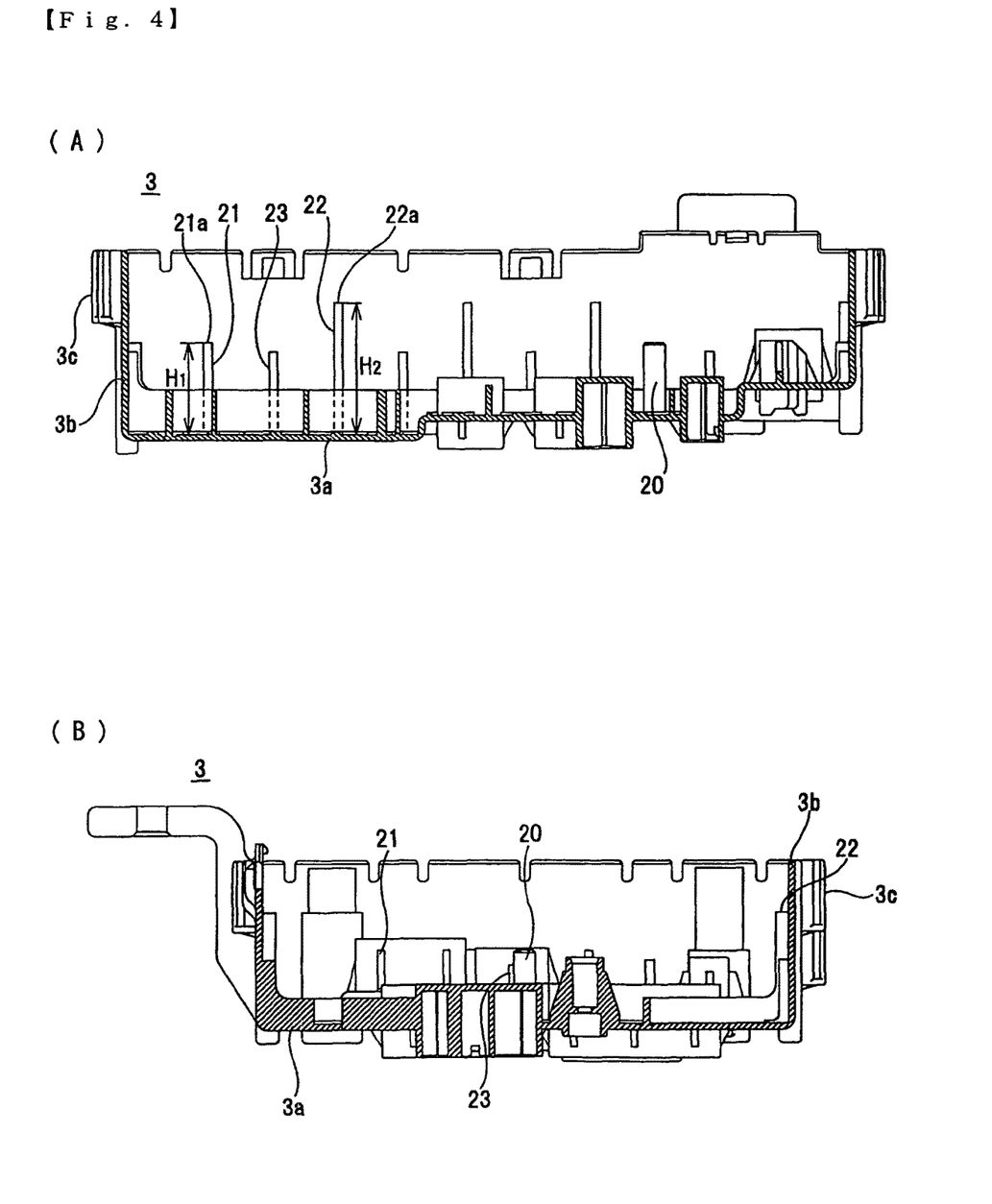
FIG. 4A is a longitudinal section view of the lower casing member.
FIG. 4B is a cross section view of the lower casing member.

As shown in FIG. 3, the lower casing member 3 may include a cylindrical boss 20 projecting from a central area on an inner surface of a bottom wall 3a. Also, as shown in FIGS. 4A and 4B, an L-shaped rib assembly including first rib members 21 and second rib members 22 may project from an inner peripheral surface of the bottom wall 3a to the inner surface of the peripheral wall 3b.

Figure 5:
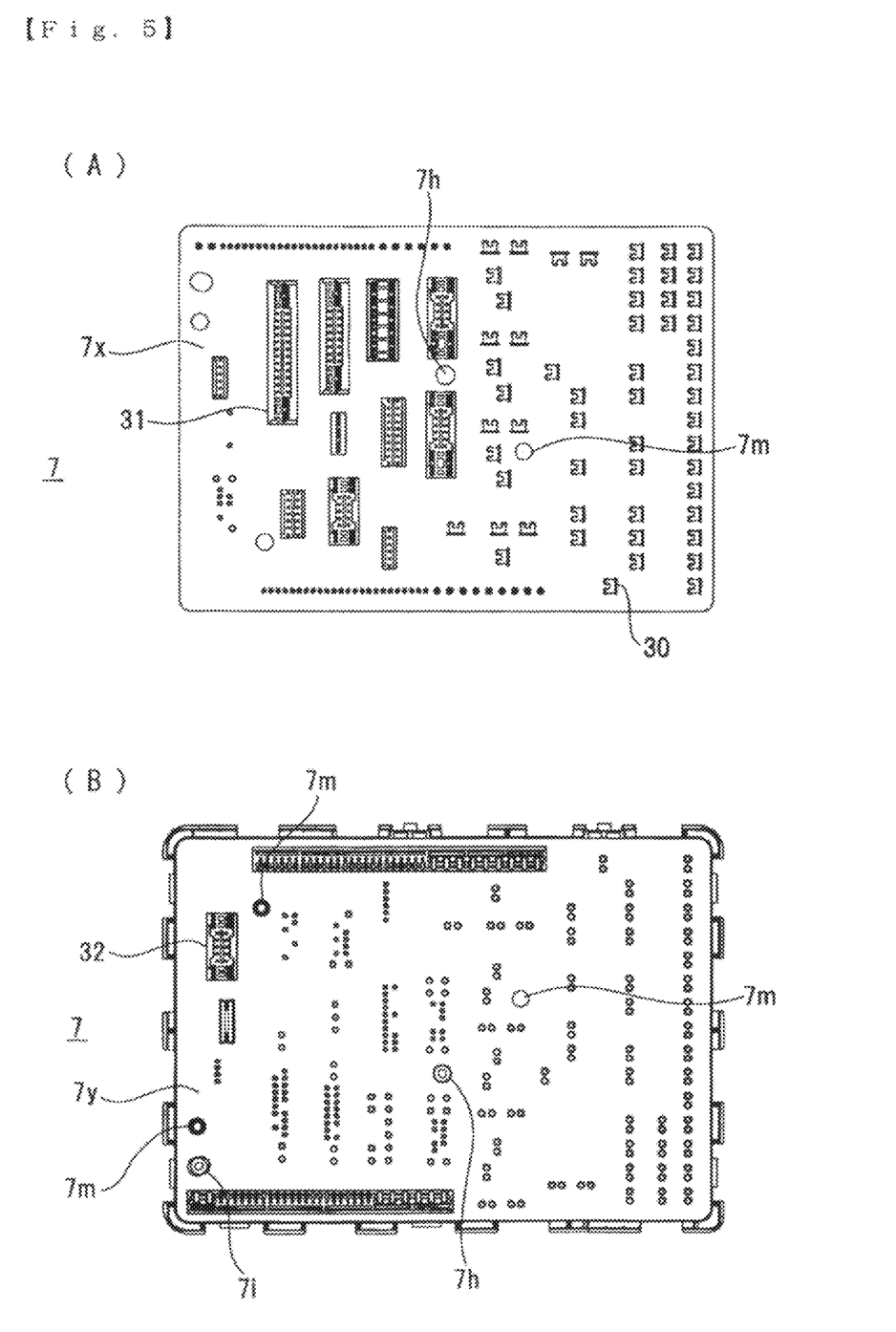
FIG. 5A is a top view of an upper layer circuit board.
FIG. 5B is a bottom view of the upper layer circuit board.

As shown in FIGS. 5A and 5B, upper layer circuit board 7 may be a rectangular configuration. An outer peripheral surface of upper layer circuit board 7 may have a size that may be fitted inside the peripheral wall 3b of the lower casing member 3. As shown in FIG. 5A, terminals 30 may be directly soldered on a top surface 7x of upper layer circuit board 7. Although connectors 31 are soldered on the top surface 7x, no electronic component is mounted on the upper surface 7x. Although a connector 32 is soldered on a bottom surface 7y of upper layer circuit board 7, as shown in FIG. 5B, no electronic component is mounted on the bottom surface 7y.

Figure 6:
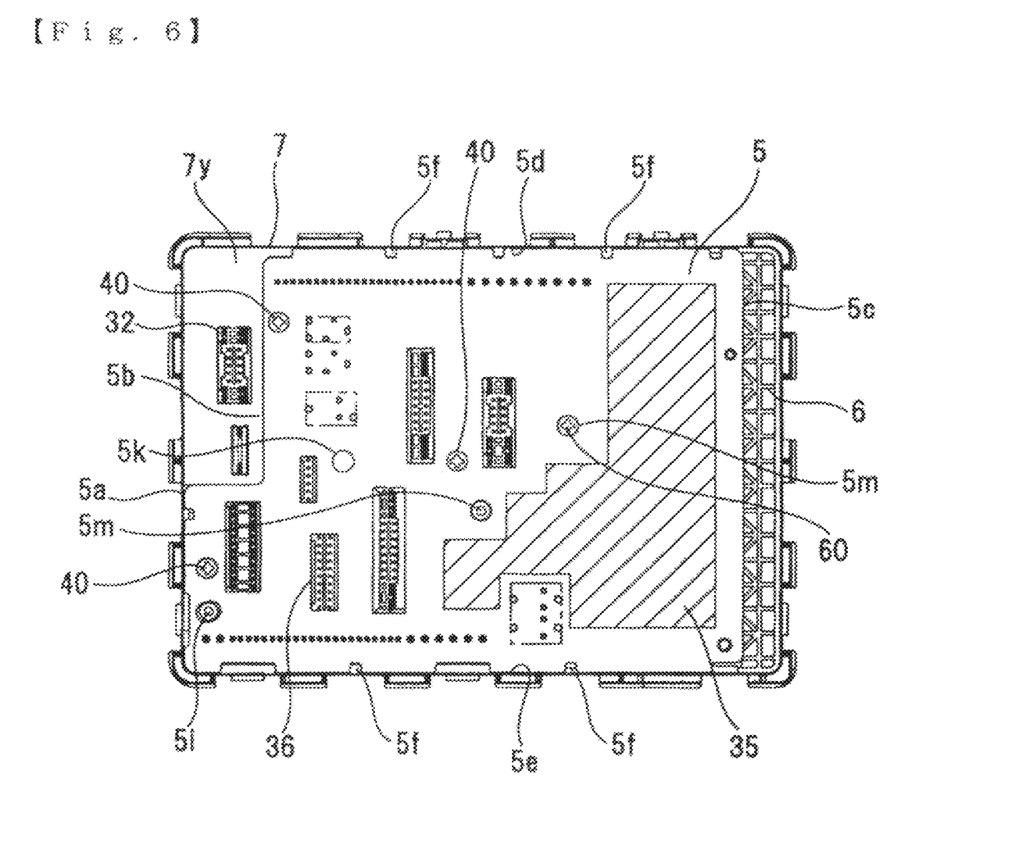
FIG. 6 is a bottom view of a multilayered circuit board assembly interposing an insulation plate between an upper layer circuit board and a lower layer circuit board.

As shown in FIG. 6, when upper layer circuit board 7 is mounted on insulation plate 6, lower layer circuit board 5 becomes a rectangular configuration except for a cutout space 5b in a part of a side edge 5a. The connector 32 mounted on the bottom surface 7y of the upper layer 7 may be disposed in the cutout space 5b. A part of side edge 5a (a portion that is not provided with the cutout space 5b) may extend along the peripheral wall 3b of the lower casing member 3. A side edge 5c may be faced to the side edge 5a and spaced apart from the peripheral wall 3b of the lower casing member 3 by a given distance, so that a part of the insulation plated 6 is exposed. Side edges 5d and 5e perpendicular to the side edges 5a and 5c may extend along the peripheral wall 3b of the lower casing member 3 and are provided with rib-receiving cutout spaces 5f spaced apart from one another.

As shown in FIG. 6, an electronic component mounting section 35 including microchips (not shown) may be provided on the bottom surface 5y of lower layer circuit board 5 and a connector may be soldered on the bottom surface 5y.

Figure 7:
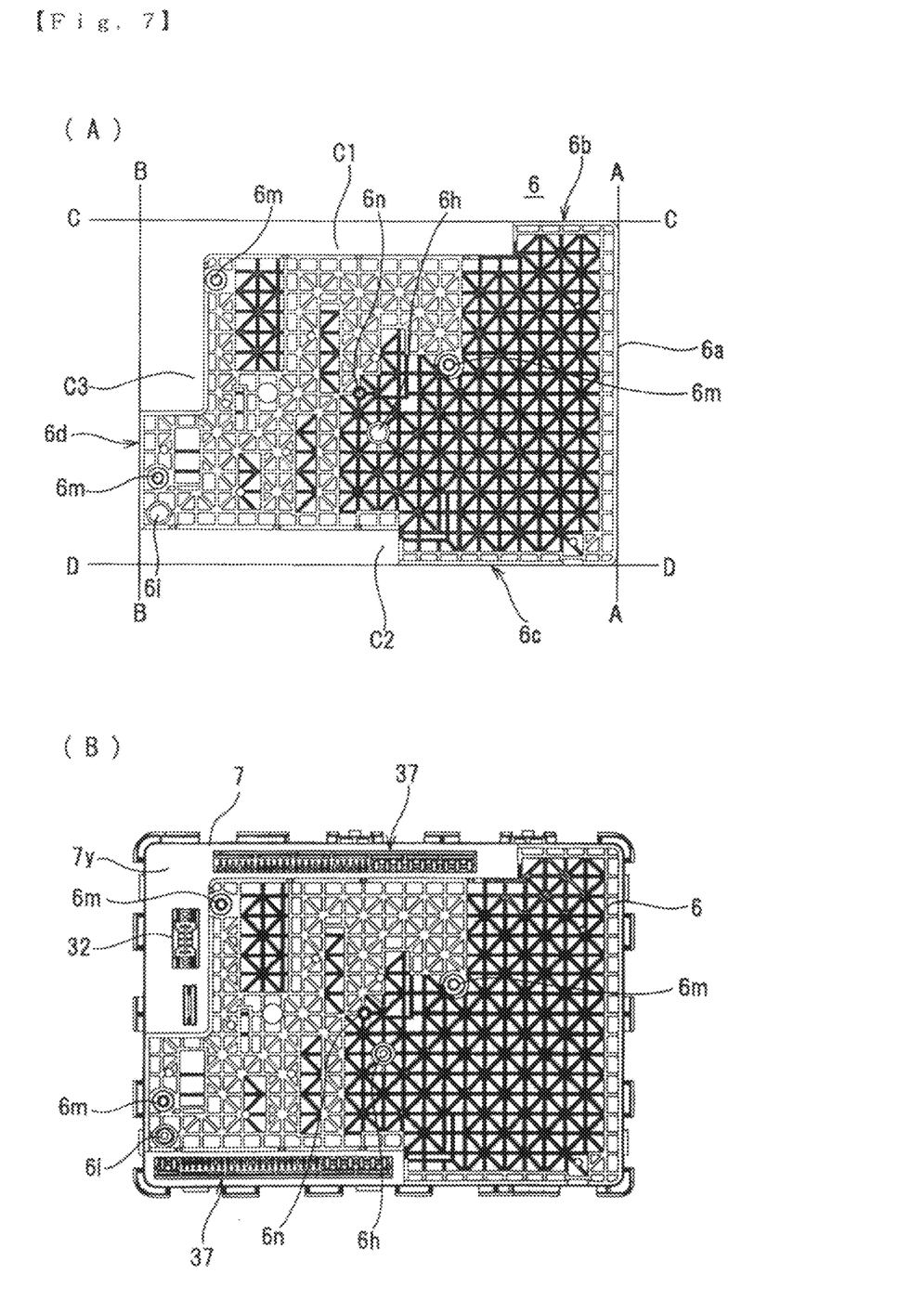
FIG. 7A is a bottom view of an insulation plate.
FIG. 7B is a bottom view of the insulation plate, illustrating the insulation plate attached to the upper layer circuit board.

FIG. 7A is a bottom view of the insulation plate 6 that may be interposed between the lower circuit board 5 and upper layer circuit board 7. FIG. 7B is a bottom view of the insulation plate 6 attached to upper layer circuit board 7. As shown in FIG. 7A, parts of the insulation plate 6 may be cut out at three edges B-B, C-C, and D-D. A whole edge A-A of the peripheral wall 6a of the insulation plate 6 may extend along the inner surface of the peripheral wall 3b of the lower casing member 3. The insulation plate 6 may be provided on three edges B-B, C-C, and D-D of the peripheral wall 6a with cutout spaces C3, C1, and C2, respectively. Peripheral walls 6b, 6c, and 6d, which are not provided with the cutout spaces C1, C2, and C3, may extend along the peripheral wall 3b of the lower casing member 3.

Connectors 37 mounted on upper layer circuit board 7 may be disposed in cutout space C1 and in cutout space C2. Connector 32 mounted on upper layer circuit board 7 may be disposed in cutout space C3. Connectors 37 may serve to interconnect conductors on upper layer circuit board 7 and lower layer circuit board 5 to one another.

As shown in FIG. 4A, a height H1 of each of first rib members 21 provided on lower casing member 3 may be set to be smaller than a height H2 of each of second rib members 22 provided on lower casing member 3 by a thickness of insulation plate 6, e.g., H1<H2.

An upper end 21a of each first rib member 21 may pass an outside of a peripheral edge of lower layer circuit board 5 and cutout spaces 5f in the peripheral edge to contact a bottom surface of the peripheral edge of insulation plate 6.

An upper end 22a of each second rib member 21 may pass the peripheral edge of lower layer circuit board 5 and cutout spaces 5f in the peripheral edge to contact bottom surface 7y of upper layer circuit board 7 on which no electronic component is mounted.

As shown in FIGS. 4A and 4B, reinforcing ribs 23, each having a height lower than that of each first rib member 21, may be provided between first rib member 21 and second rib member 22 in order to reinforce peripheral wall 3b of lower casing member 3. Upper ends of reinforcing ribs 23 do not contact the bottom surface of lower layer circuit board 5.

Boss 20 may penetrate a through-hole 5k (FIG. 9) in lower layer circuit board 5 and contacts with the bottom surface of insulation plate 6. A height of boss 20 may have substantially the same height of each first rib member 21.

Furthermore, lower layer circuit boar 5 and insulation plate 6 may be provided substantially on central parts with screw apertures 5n and 6n that are aligned with each other upon assembling. A second screw 40 is screwed into the aligned screw apertures 5n and 6n.

Figure 8:
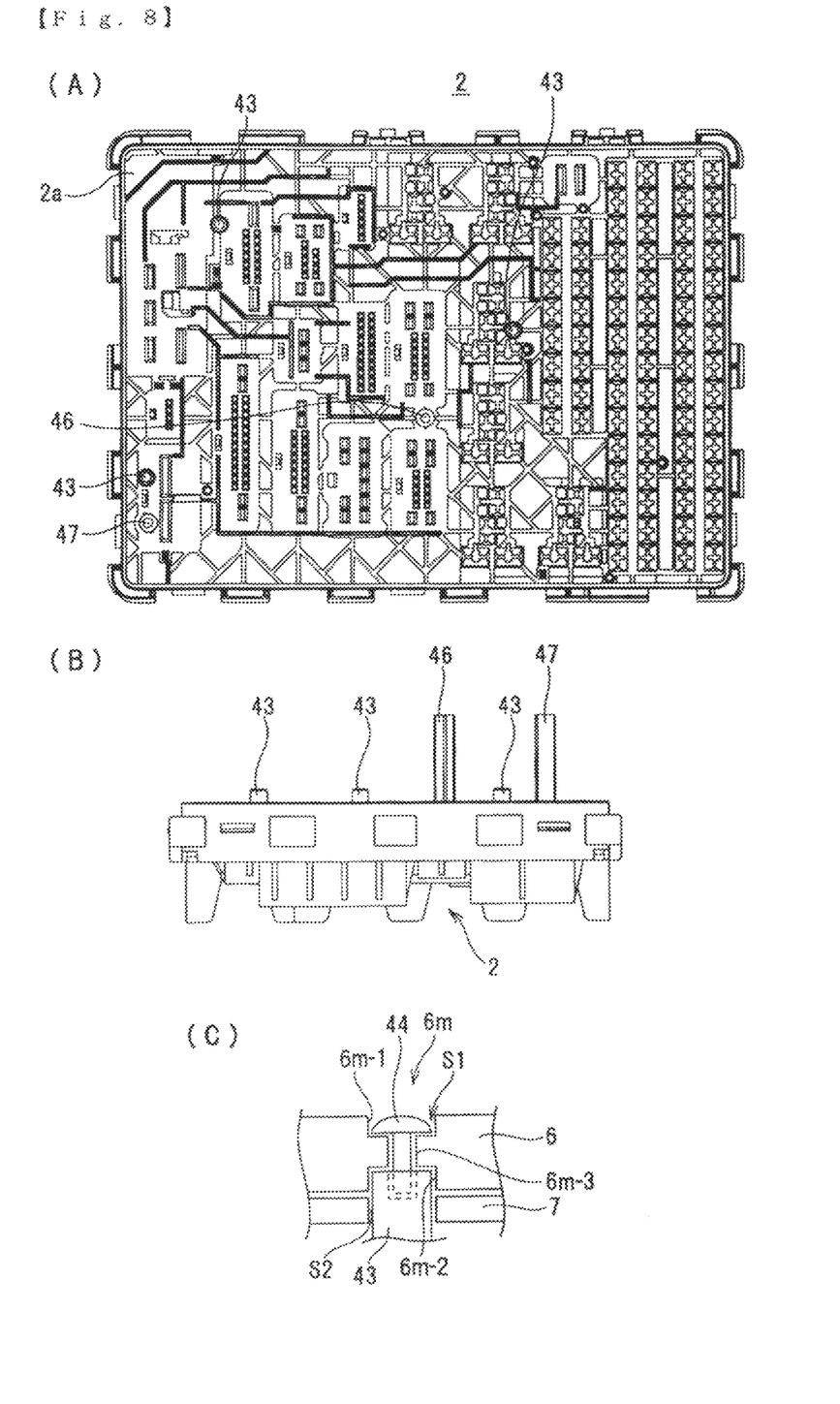
FIG. 8A is a bottom view of an upper casing member, illustrating an interior of the upper casing member.
FIG. 8B is a side elevation view of the upper casing member shown in FIG. 8A.
FIG. 8C is an enlarged view of a main part of the upper casing member shown in FIG. 8B.

Insulation plate 6 and upper layer circuit boar 7 may also be provided with three screw apertures 6m and 7m that are aligned with one another upon assembling them. As shown in FIG. 8C in greater detail, each screw aperture 6m in insulation plate 6 may be provided with an upper opening 6m-1, a lower opening 6m-2, and an intermediate opening 6m-3 in a thickness direction of the insulation plate 6. Intermediate opening 6m-3 may be provided between the upper and lower openings 6m-1 and 6m-2 and may have a smaller opening area than that of each of the openings 6m-1 and 6m-2. Each screw aperture 6m may include a space S1 for receiving a head of a first screw mentioned after and a space S2 for receiving a distal end of a screw cylinder 43.

As shown in FIGS. 8A to 8C, the respective screw apertures 6m and 7m may be provided in portions corresponding to the three screw cylinders 43 projecting from the inner surface of the upper wall 2a of the upper casing member 2. Screw apertures 6m, 7m, and screw cylinders 43 may be aligned on the same line and each of the first screws 44 may be screwed into each of the screw apertures 6m. Thus, because the head of each first screw 44 is contained in each space S1 without exposing the head outward, and because the distal end of each screw cylinder 43 is contained in each space S2, the upper casing member 2, upper layer circuit board 7, and insulation plate 6 are securely fastened to one another.

Three screw cylinders 43 may be provided substantially on the central part of upper wall 2a of upper casing member 2 and on opposite sides of at least one edge of peripheral wall 2b. An area enclosed by a triangle defined by the three screw cylinders 43 may be disposed on a back side of the fuse-containing section 12, relay-containing section 13, and connector-containing section 14 on the upper casing member 2. Also, boss 20 projecting from bottom wall 3a of lower casing member 3 may be disposed in the area enclosed by the triangle. Thus, it is possible for the three screw cylinders 43 and boss 20 to moderate a stress caused when electrical components (not shown) are coupled to fuse-containing section 12, relay-containing section 13, and connector-containing section 14. Consequently, it is possible to prevent stress from affecting the electronic mounting section 35 (e.g., that may result in detachment of the electronic component), in particular, on lower layer circuit board 5.

Insulation plate 8 which may be interposed between upper circuit board 7 and upper casing member 2 may also be provided on positions corresponding to the screw cylinders 43 with screw apertures 8m.

In addition, a positioning boss 46 may project substantially from a central part of the upper wall 2a of upper casing member 2 while a position-adjusting boss 47 may project from a corner of the upper wall 2a. On the other hand, insulation plate 8, upper layer circuit board 7, insulation plate 6, and lower layer circuit board 5 may be provided in positions corresponding to boss 46 with circular apertures 8h, 7h, 6h, and 5h and in positions corresponding to boss 47 with elongated apertures 8i, 7i, 6i, and 5i.

Next, an example embodiment of a method for assembling electrical junction box 1 in accordance with the present invention will be described.

FIG. 9 schematically shows a method of assembling electrical junction box 1. When assembling electrical junction box 1, upper casing member 2 may be turned upside down so that upper wall 2a becomes a bottom side. Turned upper casing member 2 may be held on an assembling jig 50.

Attaching piece 9a, previously bent from each bus bar 9, may be pressed into and held in the inner surface of upper wall 2a of upper casing member 2 to secure bus bar 9 to upper casing member 2. However, bus bar 9 may be secured to upper casing member 2 with member 2 being held on assembling jig 50.

Insulation plate 8 may be inserted into upper casing member 2 held on assembling jig 50 described above. Then, boss 46 may pass through circular aperture 8h, boss 47 may pass through elongated aperture 8i, and screw cylinder 43 may pass through screw aperture 8m.

After insulation plate 8 is attached to upper casing member 2, upper layer circuit board 7 may be attached to upper casing member 7. Then, boss 46 and boss 47, and each screw cylinder 43 may be inserted into circular aperture 7h, elongated aperture 7i, and screw aperture 7m in upper layer circuit board 7, respectively.

Next, insulation plate 6 may be attached to upper casing member 2, and boss 46, boss 47, and each screw cylinder 43 may be inserted into spaces S2 in circular aperture 6h, elongated aperture 6i, and screw aperture 6m, respectively, in insulation plate 6.

Figure 10:
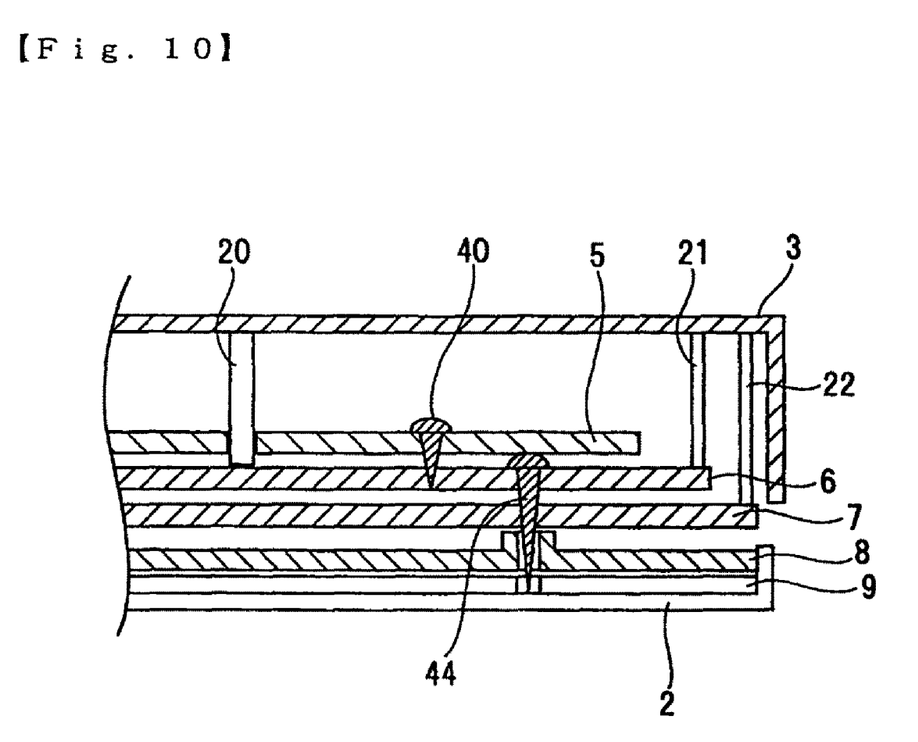
FIG. 10 is a sectional view of a main part of the casing and multilayered circuit board assembly, illustrating them under an assembled position.

Under this condition, each first screw 44 may be screwed into each screw cylinder 43. In this manner, as shown in FIG. 2 and FIG. 10, insulation plate 6, upper layer circuit board 7, and insulation plate 8 may be secured to the upper casing member 2.

Next, lower layer circuit board 5 may be attached to upper casing member 2, and boss 46 and boss 47 may pass through circular aperture 5h and elongated aperture 5i, respectively. Each screw aperture 5n in lower layer circuit board 5 may be aligned with each screw aperture 6n in insulation plate 6 to be communicated with each other. Each second screw 40 may be screwed into each of screw aperture 5n and screw aperture 6n. In this manner, as shown in FIG. 2 and FIG. 10, lower layer circuit board 5 may be secured to insulation plate 6. Because insulation plate 6 together with upper layer circuit board 7 are secured to upper casing member 2 by first screws 44, after lower layer circuit board 5 is mounted on insulation plate 6, lower layer circuit board 5 can be secured to insulation plate 6 by a single step of fastening second screws 40.

Finally, lower casing member 3 may be turned upside down, so that bottom wall 3a becomes an upper surface, and mounted onto upper casing member 2. When assembling, boss 20 projecting from bottom wall 3a of lower casing member 3 may penetrate a through-hole 5k in lower layer circuit board 5 so that a distal end of boss 20 contacts the bottom surface of insulation plate 6, thereby positioning and holding insulation plate 6.

First rib members 21 may be inserted into cutout spaces 5f provided in an outside and an outer peripheral edge of lower layer circuit board 5, and distal ends of first rib members 21 contact with a bottom surface of a peripheral edge of insulation plate 6.

Second rib members 22 may pass through cutout spaces 5f provided in an outside and an outer peripheral edge of lower layer circuit board 5 and may further pass the peripheral edge of insulation plate 6. Distal ends of second rib members 22 may contact a bottom surface of upper layer circuit board 7, on which no electronic component is mounted.

Thus, boss 20 and first rib members 21 position and hold insulation plate 6 fixed to lower layer circuit board 5 by second screws 40 and the second rib members position and hold upper layer circuit board 7 fixed to insulation plate 6 by first screws 44.

Finally, after lower casing member 3 is aligned with upper casing member 2, and locking portions 2c and locked portions 3c are interlocked to one another. Boss 46 and boss 47 projecting from upper casing member 2 may be inserted into screw cylinders 25 on lower casing member 3 and third screws 48 (FIG. 2) may be screwed into boss 46 and boss 47. Thus, the process for assembling the electrical junction box 1 is completed.

As described above, when positioning and holding lower layer circuit boards 5 and upper layer circuit board 7, boss 20, first rib member 21 and second rib member 22 projecting from the lower casing member 3 do not contact the bottom surface of lower layer circuit board 5, on which an electronic component may be mounted. The distal ends of the second rib members 22 may contact a peripheral edge of the bottom surface of upper layer circuit board 7, but no electronic component is mounted on the bottom surface of upper layer circuit board 7. That is, boss 20, first rib member 21 and second rib member 22 do not contact with the surface of the multilayered circuit board assembly on which the electronic component is mounted. Thus, no load is applied to upper layer circuit boards 7 and lower layer circuit board 5. Consequently, no stress is caused on the surface of the multilayered circuit board assembly, on which an electronic component is mounted, thereby eliminating a possibility of detachment of the electronic component.

The present invention is not limited to the exemplary embodiments described above.

For example, upper layer circuit board 7 may be previously bonded to the top surface of insulation plate 6 by an adhesive, and lower layer circuit board 5 and insulation plate 6 may be connected by second screws 44 to previously integrate them. Alternatively, lower layer circuit board 5 and upper layer circuit board 7 may be bonded to the top and bottom surfaces of insulation plate 6 by an adhesive.

Furthermore, insulation plate 6 may be provided with a through-hole that receives boss 20 projecting from lower casing member 3, a distal end of boss 20 may contact with the bottom surface of upper layer circuit board 7, on which no electronic component is mounted, so that boss 20 supports upper layer circuit board 7.

In addition, because bus bar 9 may be directly secured to the inner surface of upper wall 2a of upper casing member 2 in embodiments described above, insulation plate 8 may be disposed in upper casing 2. However, in embodiments in which the bus bar 9 is not fixed directly on upper casing member 2, it is not necessary to provide insulation plate 8.

Although upper casing member 2 may be turned topside down and upper layer circuit board 7 and lower layer circuit board 5 may be inserted into upper casing member 2 in embodiments described above, lower layer circuit board 5, insulation plate 6, upper layer circuit board 7, and insulation plate 8, in order, may be inserted into lower casing member 3 and then upper casing member 2 may be mounted on lower casing member 3.

The present invention is not limited to the embodiments described above and any embodiments that do not depart the spirit of the present invention fall within the scope of the present invention.

What is claimed is:

1. An electrical junction box comprising:
    a casing including:
        a lower casing member with a rib assembly and a boss, the rib assembly and the boss projecting from the lower casing member; and
        an upper casing member;
    a multilayered circuit board assembly contained in the casing, the multilayered circuit board comprising:
        a lower layer circuit board;
        an upper layer circuit board; and
        an insulation plate disposed between the upper layer circuit board and the lower layer circuit board; and
    an electronic component mounted on a top surface of the lower layer circuit board and through the insulation plate without contacting a bottom surface of the upper layer circuit board,
    wherein the upper layer circuit board and the lower layer circuit board are secured to the insulation plate, and
    the rib assembly and the boss of the lower casing member contact the insulation plate to support the insulation plate without contacting a surface of the upper layer circuit board and without contacting a surface of the lower circuit board in the multilayered circuit board assembly on which the electronic component is mounted.

2. An electrical junction box according to claim 1, wherein the rib assembly includes a first rib member and a second rib member,
    the first rib member passes a peripheral edge of the lower layer circuit board and contacts a bottom surface of a peripheral edge of the insulation plate,
    the boss passes through a through-hole in the lower layer circuit board and contacts one of a bottom surface of the insulation plate and a bottom surface of the upper layer circuit board, and
    the second rib member passes a peripheral edge of the insulation plate and contacts a bottom surface of the upper layer circuit board.

3. An electrical junction box according to claim 2, wherein the insulation plate and upper layer circuit board are provided with screw apertures that are aligned with each other, and a first screw is screwed through the aligned screw apertures into a screw cylinder projecting from an inner surface of an upper wall of the upper casing member to connect the insulation plate and upper layer circuit board to the upper casing member, and
    the lower layer circuit board and insulation plate are connected by a second screw.

4. An electrical junction box according to claim 3, wherein the boss is disposed on an area of an inner surface of a bottom wall of the lower casing member that is opposite an area of an inner surface of an upper wall of the upper casing member defined by three screw cylinders.

5. A method for assembling an electrical junction box according to claim 4, the method comprising:
    turning the upper casing member topside down to direct an opening of the upper casing member upward;
    disposing the turned upper casing member on an assembling jig;
    inserting the upper layer circuit board and the insulation plate in an order in the upper casing member;
    interconnecting the insulation plate and upper layer circuit board with a first screw;
    inserting the lower layer circuit board into the upper casing member;
    interconnecting the lower layer circuit board and insulation plate by a second screw;
    aligning the lower casing member with the upper casing member to cover the upper casing member; and
    bringing the first rib member and boss projecting from an inner surface of the lower casing member into contact with the insulation plate and bringing the second rib member into contact with a bottom surface of the upper layer circuit board to position and hold the circuit board assembly in the casing.

6. A method for assembling an electrical junction box according to claim 3, the method comprising:
    turning the upper casing member topside down to direct an opening of the upper casing member upward;
    disposing the turned upper casing member on an assembling jig;
    inserting the upper layer circuit board and the insulation plate in an order in the upper casing member;
    interconnecting the insulation plate and upper layer circuit board with a first screw;
    inserting the lower layer circuit board into the upper casing member;
    interconnecting the lower layer circuit board and insulation plate by a second screw;
    aligning the lower casing member with the upper casing member to cover the upper casing member; and
    bringing the first rib member and boss projecting from an inner surface of the lower casing member into contact with the insulation plate and bringing the second rib member into contact with a bottom surface of the upper layer circuit board to position and hold the circuit board assembly in the casing.

7. A method for assembling an electrical junction box according to claim 2, the method comprising:
    turning the upper casing member topside down to direct an opening of the upper casing member upward;
    disposing the turned upper casing member on an assembling jig;
    inserting the upper layer circuit board and the insulation plate in an order in the upper casing member;
    interconnecting the insulation plate and upper layer circuit board with a first screw;
    inserting the lower layer circuit board into the upper casing member;
    interconnecting the lower layer circuit board and insulation plate by a second screw;
    aligning the lower casing member with the upper casing member to cover the upper casing member; and
    bringing the first rib member and boss projecting from an inner surface of the lower casing member into contact with the insulation plate and bringing the second rib member into contact with a bottom surface of the upper layer circuit board to position and hold the circuit board assembly in the casing.

8. An electrical junction box according to claim 1, wherein the insulation plate and upper layer circuit board are provided with screw apertures that are communicated aligned with each other, and a first screw is screwed through aligned screw apertures into a screw cylinder projecting from an inner surface of an upper wall of the upper casing member to connect the insulation plate and upper layer circuit board to the upper casing member, and the lower layer circuit board and insulation plate are connected by a second screw.

9. An electrical junction box according to claim 8, wherein the boss is disposed on an area of an inner surface of a bottom wall of the lower casing member that is opposite an area of an inner surface of an upper wall of the upper casing member defined by three screw cylinders.

10. A method for assembling an electrical junction box according to claim 9, the method comprising:
turning the upper casing member topside down to direct an opening of the upper casing member upward;
disposing the turned upper casing member on an assembling jig;
inserting the upper layer circuit board and the insulation plate in an order in the upper casing member;
interconnecting the insulation plate and upper layer circuit board with a first screw;
inserting the lower layer circuit board into the upper casing member;
interconnecting the lower layer circuit board and insulation plate by a second screw;
aligning the lower casing member with the upper casing member to cover the upper casing member; and
bringing the first rib member and boss projecting from an inner surface of the lower casing member into contact with the insulation plate and bringing the second rib member into contact with a bottom surface of the upper layer circuit board to position and hold the circuit board assembly in the casing.

11. A method for assembling an electrical junction box according to claim 8, the method comprising:
turning the upper casing member topside down to direct an opening of the upper casing member upward;
disposing the turned upper casing member on an assembling jig;
inserting the upper layer circuit board and the insulation plate in an order in the upper casing member;
interconnecting the insulation plate and upper layer circuit board with a first screw;
inserting the lower layer circuit board into the upper casing member;
interconnecting the lower layer circuit board and insulation plate by a second screw;
aligning the lower casing member with the upper casing member to cover the upper casing member; and
bringing the first rib member and boss projecting from an inner surface of the lower casing member into contact with the insulation plate and bringing the second rib member into contact with a bottom surface of the upper layer circuit board to position and hold the circuit board assembly in the casing.

12. An electrical junction box comprising:
a casing comprising:
a lower casing member with a rib assembly and a boss, the rib assembly and the boss projecting from the lower casing member; and
an upper casing member; and
a multilayered circuit board assembly contained in the casing, the multilayered circuit board comprising:
a lower layer circuit board;
an upper layer circuit board; and
an insulation plate disposed between the upper layer circuit board and the lower layer circuit board,
wherein the upper layer circuit board and the lower layer circuit board are secured to the insulation plate, and
wherein the rib assembly and the boss of the lower casing member contact the insulation plate to support the insulation plate without contacting a surface of the upper layer circuit board and without contacting a surface of the lower circuit board in the multilayered circuit board assembly.

13. An electrical junction box according to claim 12, wherein the rib assembly includes a first rib member, and wherein the first rib member passes a peripheral edge of the lower layer circuit board and contacts a bottom surface of a peripheral edge of the insulation plate.

14. An electrical junction box according to claim 12, wherein the boss passes through a through-hole in the lower layer circuit board and contacts one of a bottom surface of the insulation plate and a bottom surface of the upper layer circuit board.

15. An electrical junction box according to claim 12, wherein the rib assembly includes a first rib member, and wherein the first rib member passes a peripheral edge of the insulation plate and contacts a bottom surface of the upper layer circuit board.

16. An electrical junction box according to claim 12, wherein the rib assembly includes a first rib member and a second rib member,
wherein the first rib member passes a peripheral edge of the lower layer circuit board and contacts a bottom surface of a peripheral edge of the insulation plate,
wherein the boss passes through a through-hole in the lower layer circuit board and contacts one of a bottom surface of the insulation plate and a bottom surface of the upper layer circuit board, and
wherein the second rib member passes a peripheral edge of the insulation plate and contacts a bottom surface of the upper layer circuit board.

17. An electrical junction box according to claim 12, wherein the insulation plate and upper layer circuit board are provided with screw apertures that are aligned with each other, and a first screw is screwed through the aligned screw apertures into a screw cylinder projecting from an inner surface of an upper wall of the upper casing member to connect the insulation plate and upper layer circuit board to the upper casing member, and
wherein the lower layer circuit board and insulation plate are connected by a second screw.

18. An electrical junction box according to claim 12, wherein the insulation plate and upper layer circuit board are provided with screw apertures that are aligned with each other, and a first screw is screwed through the aligned screw apertures into a screw cylinder projecting from an inner surface of an upper wall of the upper casing member to connect the insulation plate and upper layer circuit board to the upper casing member.

19. An electrical junction box according to claim 12, wherein the boss is disposed on an area of an inner surface of a bottom wall of the lower casing member that is opposite an area of an inner surface of an upper wall of the upper casing member defined by three screw cylinders.

20. An electrical junction box according to claim 12, wherein the lower layer circuit board and upper layer circuit board are connected to the insulation plate by adhesive.

* * * * *